(12) United States Patent
Tsutsui

(10) Patent No.: US 6,199,038 B1
(45) Date of Patent: *Mar. 6, 2001

(54) SIGNAL ENCODING METHOD USING FIRST BAND UNITS AS ENCODING UNITS AND SECOND BAND UNITS FOR SETTING AN INITIAL VALUE OF QUANTIZATION PRECISION

(75) Inventor: Kyoya Tsutsui, Kanagawa (JP)

(73) Assignee: Sony Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/784,274

(22) Filed: Jan. 15, 1997

(30) Foreign Application Priority Data

Jan. 30, 1996 (JP) .................................................. 8-014518

(51) Int. Cl.[7] .............................. G10L 19/02; H03M 7/30
(52) U.S. Cl. ............................................ 704/229; 704/230
(58) Field of Search .................................. 704/229, 201, 704/230, 502; 382/248, 250, 251

(56) References Cited

U.S. PATENT DOCUMENTS

| 5,369,724 | * | 11/1994 | Lim ....................................... 704/206 |
| 5,619,570 | | 4/1997 | Tsutsui et al. ............................ 380/4 |
| 5,684,922 | * | 11/1997 | Miyakawa et al. ................... 704/229 |
| 5,717,821 | | 2/1998 | Tsutsui et al. ....................... 395/2.14 |

(List continued on next page.)

FOREIGN PATENT DOCUMENTS

2140779 * 12/1994 (CA) .................................. 704/205

OTHER PUBLICATIONS

James "Mathematic Dictionary" p. 214 Reinhold, 1992.*

J.H. Rothweiler, "Polyphase Quadrature Filters—A New Subband Coding Technique," ICASSP 83 Proceedings, IEEE International Conference on Acoustics, Speech & Signal Processing, Apr. 1983, vol. 3 of 3, pp. 1280–1283.

R.E. Crochiere et al., "Digital Coding of Speech in Sub- -Bands," American Telephone and Telegraph Company, the Bell System Technical Journal, vol. 55, No. 8, Oct. 1976, pp. 1069–1085.

J.P. Princen et al., "Subband/Transform Coding Using Filter Bank Designs Based on Time Domain Aliasing Cancellation," IEEE, 1987, pp. 2161–2164.

R. Zelinski et al., "Adaptive Transform Coding of Speech Signals," IEEE Transactions on Acoustics, Speech and Signal Processing, vol. ASSP–25, No. 4, Aug. 1977, pp. 299–309.

M.A. Krasner, "The Critical Band–Coder—Digital Encoding of Speech Signals Based on the Perceptual Requirements of the Auditory System," IEEE Journal, vol. 1–3, 1980, pp. 327–331.

Primary Examiner—David R. Hudspeth
Assistant Examiner—Harold Zintel
(74) Attorney, Agent, or Firm—Andrew V. Smith

(57) ABSTRACT

A signal encoding method for encoding input digital data by high-efficiency encoding whereby acoustic signals can be encoded on a real-time basis with small-sized hardware. The spectral signal components of an input signal are divided into first band units as encoding units, that is units used for encoding, and second band units, for setting an initial value of quantization precision. An estimated value of the required number of bits for each encoding unit is computed. A total number of bits required to encode the spectral components of the input signal is adjusted based on an estimated value of the required number of bits as separated and extracted from one encoding unit.

20 Claims, 18 Drawing Sheets

U.S. PATENT DOCUMENTS

| | | | |
|---|---|---|---|
| 5,724,612 | 3/1998 | Haneda et al. | 395/853 |
| 5,731,767 | 3/1998 | Tsutsui et al. | 341/50 |
| 5,737,718 | 4/1998 | Tsustui | 704/205 |
| 5,752,224 | 5/1998 | Tsutsui et al. | 704/225 |
| 5,754,127 | 5/1998 | Tustsui et al. | 341/54 |
| 5,754,501 | 5/1998 | Tsutsui | 369/32 |
| 5,758,020 | 5/1998 | Tsutsui | 395/213 |
| 5,758,315 * | 5/1998 | Mori | 704/229 |
| 5,761,636 * | 6/1998 | Bolton et al. | 704/229 |
| 5,870,703 * | 2/1999 | Oikawa et al. | 704/206 |

* cited by examiner (A)

| m | CODES |
|---|---|
| -1 | 11 |
| 0 | 0 |
| 1 | 10 |

(B)

| m | CODES |
|---|---|
| -3 | 1111 |
| -2 | 1101 |
| -1 | 101 |
| 0 | 0 |
| 1 | 100 |
| 2 | 1100 |
| 3 | 1110 |

FIG.7

| SPECTRUM | (a) | (b) |
|---|---|---|
| s1 | 0 | 0 |
| s2 | +1 | +1 |
| s3 | -1 | 0 |
| s4 | -1 | -1 |
| s5 | +1 | +1 |
| s6 | 0 | 0 |
| s7 | -1 | -1 |
| s8 | +1 | 0 |

FIG.11

SIGNAL ENCODING METHOD USING FIRST BAND UNITS AS ENCODING UNITS AND SECOND BAND UNITS FOR SETTING AN INITIAL VALUE OF QUANTIZATION PRECISION

BACKGROUND OF THE INVENTION

1. Field of the Invention

This invention relates to a signal encoding method for encoding input digital data by high-efficiency encoding.

2. Description of the Related Art

A variety of high-efficiency encoding techniques exist for encoding audio or speech signals. Examples of these techniques include transform coding as a blocking frequency splitting system of the blocking frequency spectrum splitting system (orthogonal transform) and a sub-band coding system (SBC) as a non-blocking frequency spectrum splitting system. In transform coding, audio signals on the time axis are blocked every pre-set time interval, the blocked time-domain signals are transformed into signals on the frequency axis, and the resulting frequency-domain signals are split into plural frequency bands and encoded from band to band. In the sub-band coding system, the audio signals on the time axis are split into plural frequency bands and encoded without blocking. In a combination of the sub-band coding system and the transform coding system, the audio signals on the time axis are split into plural frequency bands by the sub-band coding system, and the resulting band-based signals are transformed into frequency-domain signals by orthogonal transform for encoding.

As band-splitting filters used in the sub-band coding system, there is a quadrature mirror filter (QMF) discussed in R. E. Crochiere, "Digital Coding of Speech in Subbands", Bell Syst. Tech. J., Vol.55, No.8, 1976. This QMF filter divides the frequency spectrum into two bands of equal bandwidth. With the QMF filter, aliasing is not produced on subsequent synthesis of the band-split signals.

The technique of splitting the frequency spectrum is discussed in Joseph H. Rothweiler, Polyphase Quadrature Filters-A New Subband Coding Technique", ICASSP 83 BOSTON. With a polyphase quadrature filter, the signal can be split into plural frequency bands of equal bandwidths.

Among the techniques for orthogonal transform, there is known such a technique in which an input audio signal is split into frames of a predetermined time duration and the resulting frames are processed by discrete Fourier transform (DFT), discrete cosine transform (DCT) or modified DCT (MDCT) to convert the signals from the time axis to the frequency axis. Discussions of a MDCT may be found in J. P. Princen and A. B. Bradley, "Subband/Transform Coding Using Filter Bank Based on Time Domain Aliasing Cancellation", ICASSP 1987.

If DFT or DCT is used as the method for orthogonal transform of the waveform signal, and a transformation is performed with time blocks each consisting of, for example, M sample data, M independent real-number data are obtained. Since M1 sample data are overlapped between neighboring time blocks for reducing connection distortion of time blocks, M real-number data are obtained on an average for (M−M1) sample data with DFT or DCT, so that these M real-number data are subsequently quantized and encoded.

If the above-described MDCT is used as the orthogonal transform method, M independent real-number data are obtained from 2M samples resulting from overlapping N sample data with both neighboring time blocks. That is, if MDCT is used, M real-number data are obtained from M sample data on an average. These M real-number data are subsequently quantized and encoded. In the decoding apparatus, waveform elements obtained on inverse transform in each block from the codes obtained using MDCT are summed together with interference for reconstructing waveform signals.

In general, if the time block for orthogonal transform is lengthened, frequency resolution is increased, such that the signal energy is concentrated in specified spectral signal components. Therefore, by employing MDCT in which a long time block length obtained by overlapping one-half sample data between neighboring time blocks is used for orthogonal transform and in which the number of resulting spectral signal components is not increased as compared to the number of original time-domain sample data, a higher encoding efficiency may be realized than if the DFT or DCT is used. If a sufficiently long overlap between neighboring time blocks is used, connection distortion between time blocks of waveform signals can be reduced.

By quantizing signal components split from band to band by a filter or orthogonal transform, it becomes possible to control the band subjected to quantization noise, thus enabling encoding with perceptually higher encoding efficiency by exploiting masking effects. By normalizing respective sample data with maximum value of the absolute values of the signal components in each band prior to quantization, the encoding efficiency may be improved further.

As the band splitting width used for quantizing the signal components resulting from splitting of the frequency spectrum of the audio signals, the band width taking into account the psychoacoustic characteristics of the human being is preferably used. That is, the frequency spectrum of the audio signals is preferably split into a plurality of, for example, 25, critical bands. The width of the critical bands increases with increasing frequency. In encoding the band-based data in such case, bits are fixedly or adoptively allocated among the various critical bands. For example, when applying adaptive bit allocation to the special coefficient data resulting from a MDCT, the spectral coefficient data generated by the MDCT within each of the critical bands is quantized using an adoptively allocated number of bits. The following two techniques are known bit allocation techniques.

In R. Zelinsky and P. Noll, "Adaptive transform Coding of Speech Signals", IEEE Transactions of Acoustics, Speech and Signal processing", vol. ASSP-25, August 1977, bit allocation is carried out on the basis of the amplitude of the signal in each critical band. This technique produces a flat quantization spectrum and minimizes noise energy, but the noise level perceived by the listener is not optimum because the technique does not exploit the psychoacoustic masking effect.

In M. A. Krassener, "The Critical Band Coder-Digital Encoding of the Perceptual Requirements of the Auditory System", there is described a technique in which the psychoacoustic masking effect is used to determine a fixed bit allocation that produces the necessary bit allocation for each critical band. However, with this technique, since the bit allocation is fixed, non-optimum results are obtained even for a strongly tonal signal such as a sine wave.

For overcoming this problem, it has been proposed to divide the bits that may be used for bit allocation into a fixed pattern allocation fixed for each small block and a bit allocation portion dependent on the amplitude of the signal in each block. The division ratio is set depending on a signal related to the input signal such that the division ratio for the fixed allocation pattern portion becomes higher the smoother the pattern of the signal spectrum.

With this method, if the audio signal has high energy concentration in a specified spectral signal component, as in the case of a sine wave, abundant bits are allocated to a block containing the signal spectral component for significantly improving the signal-to-noise ratio as a whole. In general, the hearing sense of a human being is highly sensitive to a signal having sharp spectral signal components, so that, if the signal-to-noise ratio is improved by using this method, not only the numerical values as measured can be improved, but also the audio signal as heard may be improved in quality.

Various other bit allocation methods have been proposed and the perceptual models have become refined, such that, if the encoder is of high ability, a perceptually higher encoding efficiency may be realized.

In these methods, it has been customary to find a real-number reference value of bit allocation whereby the signal to noise ratio as found by calculations will be realized as faithfully as possible and to use an integer approximate to this reference value as the allocated number of bits.

In the U.S. Pat. No. 5,778,339 as filed by the present Assignee, there is disclosed an encoding method in which a perceptually critical tonal component, that is a spectral signal component exhibiting a signal energy concentration in the vicinity of a specified frequency, is separated from other spectral signal components, and encoded in separation from other spectral components. This method enables audio signals to be encoded efficiently with high efficiency without substantially producing perceptual deterioration of audio signals.

In constructing an actual codestring, it suffices to encode the quantization precision information and the normalization coefficient information with a predetermined number of bits for each band designed for normalization and quantization and to encode the normalized and quantized spectral signal components.

In MPEG-1 audio, there is disclosed a high-efficiency encoding system in which the number of bits representing the quantization precision information will be different values from band to band. Specifically, the number of bits representing the quantization precision information is set to be smaller with increasing frequency.

There is also known a method in which the quantization precision information is determined from, for example, the normalization coefficient information by a decoder without directly encoding the quantization precision information. Since the relation between the normalization coefficient information and the quantization precision information is set at the time of standard formulation, it becomes impossible to introduce quantization precision control based on an advanced perceptual model in the future. In addition, if there is allowance in the compression ratio to be realized, it becomes necessary to set the relation between the normalization coefficient information and the quantization precision information from one compression ratio to another.

In D. A. Huffman, "A Method for Construction of Minimum Redundancy Codes", Proc. I.R.E., 40, p.1098 (1952), quantized spectral signal components are encoded more efficiently by encoding using variable length codes.

In the United States Application Ser. 08/491,948, now U.S. Pat. No. 5,778,339 filed by the present Assignee, it is proposed to adjust the normalization coefficients in case of using variable length codes for more efficient encoding of the quantized spectral signal components with a smaller number of bits. With this method, there is no risk of significant signal dropout in a specified area in case of raising the compression ratio. In particular, there is no risk of dropout or appearance of specified band signal components on the frame basis, thus avoiding the problem of generation of perceptually objectionable harsh noise. In addition, since it suffices to modify the normalization coefficient, encoding may be realized using small-sized hardware.

However, if the normalization coefficient is modified from its optimum value, the quantization noise is increased for the band. Thus, if the normalization coefficient is modified to more than a necessary extent, wasteful sound quality degradation tends to be produced.

SUMMARY OF THE INVENTION

It is therefore an object of the present invention to provide a signal encoding method whereby wasteful sound quality degradation may be diminished.

According to the present invention, there is provided a signal encoding method in which the frequency spectrum of an input signal is split and the resulting band-based signal components are quantized and subsequently encoded by variable length encoding, wherein a range for giving a short codelength to signal components in each band is set to a large value so that the frequency of quantizing the signal components to a short codelength will become larger than if the band-based quantization is performed for diminishing the total quantization error energy in each band.

With the signal encoding method of the present invention, the range of values quantized to a specified quantized value is modified for diminishing wasteful sound quality degradation.

Also, with the signal encoding method of the present invention, a variety of encoding methods for increasing the compression ratio can be carried out efficiently with sufficient signal quality for real-time encoding of the acoustic signal with small-sized hardware.

BRIEF DESCRIPTION OF THE DRAWINGS

FIG. 7 shows a table for illustrating a typical encoding method.

FIG. 11 shows a table for illustrating the number of bits used for normalizing and quantizing the spectral signal components.

DESCRIPTION OF THE PREFERRED EMBODIMENTS

Figure 1:
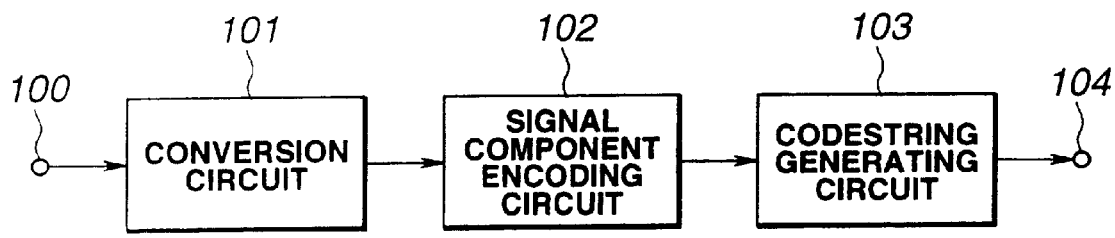
FIG. 1 is a block circuit diagram showing an illustrative structure of a conventional encoder for carrying out the signal encoding method according to the present invention.

Referring to the drawings, preferred embodiments of the present invention will be explained in detail.

FIG. 1 shows, in a block diagram, an illustrative and conventional structure of an encoder (encoding apparatus) for encoding acoustic waveform signals according to the present invention.

In the structure of FIG. 1, an acoustic waveform signal entering an input terminal 100 is transformed by a transform circuit 101 into frequency signal components (spectral signal components) which are sent to a signal component encoding circuit 102 for encoding. The resulting encoded signals are sent to a codestring generating circuit 103 to be formed into a codestring which is output at an output terminal 104. The codestring output at the output terminal 104 is conventionally modulated, after appendage of error correction codes thereto, to be then recorded on a recording medium, such as magnetic tape, or transmitted over a transmission medium, such as communication cable or electrical waves.

Figure 2:
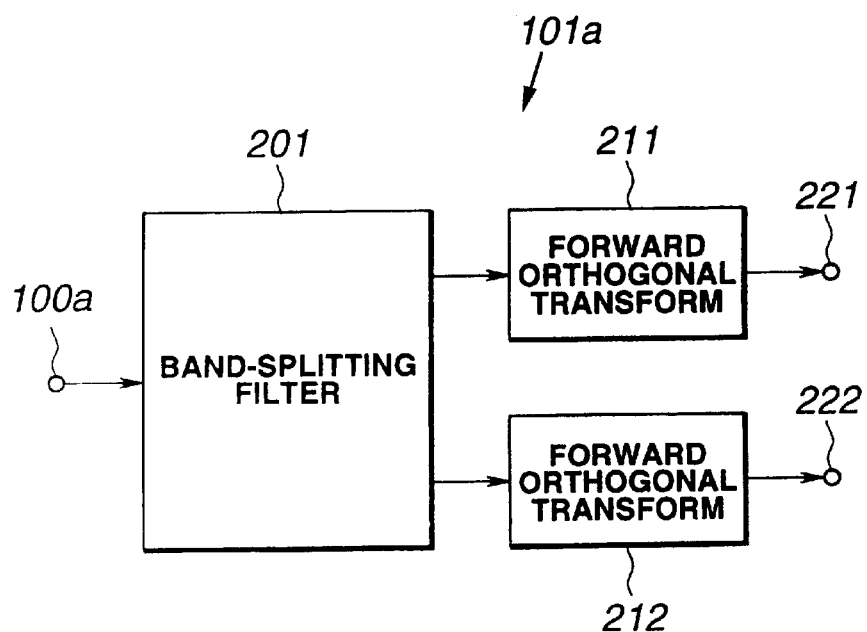
FIG. 2 is a block circuit diagram showing an illustrative structure of a conversion circuit of an encoder in accord with the present invention.

FIG. 2 shows an illustrative structure of a transform circuit 101a in accord with the present invention. A signal entering a terminal 100a is split by a band-splitting filter 201 into two bands. The resulting band-split signals are transformed into spectral signal components by forward orthogonal transform circuits 211, 212 performing orthogonal transform, such as MDCT. The input terminal 100a of FIG. 2 corresponds to the input terminal 100 of FIG. 1, except that the transform circuit 101a has two outputs. The spectral signal components, output by the terminals 221, 222 of FIG. 2, are sent to a signal component encoding circuit. In the configuration of FIG. 2, the bandwidths of two signals output by the band-splitting filter 201 are one-half of the bandwidth of the input signal at terminal 100a, such that the signal output by the band-splitting filter 201 is decimated to one-half the input signal at terminal 100a. Of course, the transform circuit 101a may be configured otherwise in addition to the configuration shown in FIG. 2. For example, the input signal may be directly transformed by MDCT into spectral signal components without being split into bands. Alternatively, the input signal may be transformed by DFT or DCT instead of by MDCT. Although the signal may be split into finer band components by a band-splitting filter, the above orthogonal transform is preferably used in the present invention since then a large number of frequency components may be obtained by a smaller processing volume.

Figure 3:
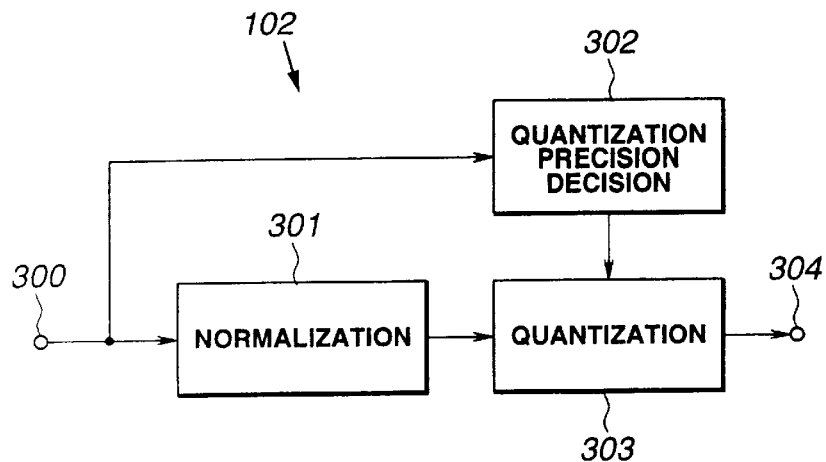
FIG. 3 is a block circuit diagram showing an illustrative structure of a signal component encoding circuit of the encoder of FIG. 1.

FIG. 3 shows an illustrative and conventional structure of the signal component encoding circuit 102. The spectral signal components supplied to a terminal 300 are received and normalized by a normalizing circuit 301 from one pre-set band to another and are also received by a quantization precision decision circuit 302. A quantization circuit 303 quantizes the normalized values based on the quantization precision as computed from the spectral signal components. The spectral signal components, sent to the terminal 300 of FIG. 3, correspond to the output signal of the transform circuit 101 of FIG. 1, and become an input signal to the codestring generating circuit 103 of FIG. 1 output from a terminal 304 of FIG. 3. The output signal of terminal 304 of FIG. 3 contains the normalization coefficient information and quantization precision information, in addition to the quantized signal components (quantized values). Thus the normalization coefficient information and quantization precision information are processed, along with the codestring, to be recorded on the recording medium or transmitted over the transmission medium.

Figure 4:
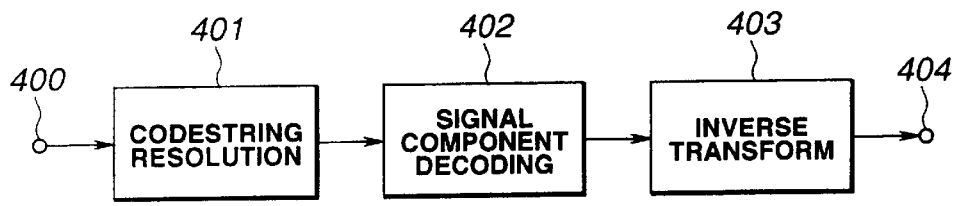
FIG. 4 is a block circuit diagram showing an illustrative structure of a decoder for carrying out decoding as a counterpart of encoding by the encoding method of the present invention.

FIG. 4 shows, in a block diagram, an illustrative and conventional structure of a decoder (decoding apparatus) for decoding acoustic signals from the codestring generated by the encoder of FIG. 1 and for outputting the decoded signal.

Referring to FIG. 4, the codestring recorded on the recording medium, reproduced, demodulated and corrected for errors, or the codestring transmitted over the transmission medium, demodulated and corrected for errors, is supplied to an input terminal 400. The codestring supplied to the input terminal 400 is sent to a codestring resolution circuit 401 in which the codes of the respective spectral signal components are extracted from the codestring and separated from the codes of the quantization precision information and the normalization coefficient information. These codes are sent to a signal component decoding circuit 402 which then decodes the respective spectral signal components using the quantization precision information and the normalization coefficient information. The decoded respective spectral signal components are processed by an inverse transform circuit 403 with an inverse transform which is the reverse of the orthogonal transform described above, so as to be thereby transformed into acoustic waveform signals which are output at an output terminal 404.

Figure 5:
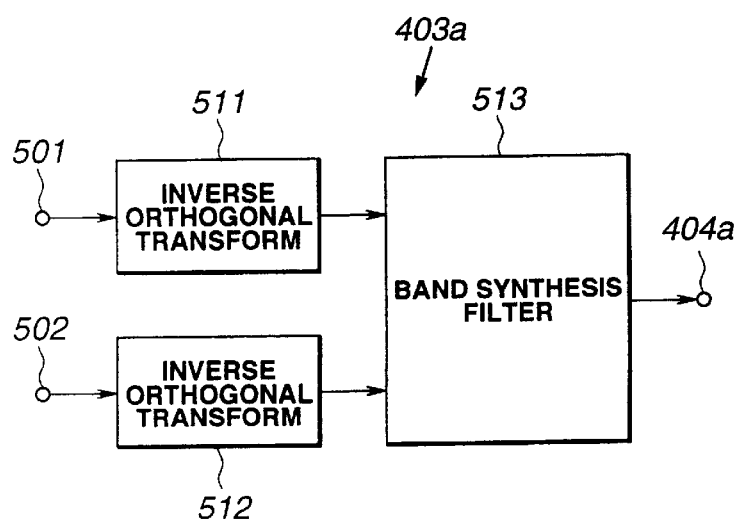
FIG. 5 is a block circuit diagram showing an illustrative structure of a back-conversion circuit of a decoder in accord with the present invention.

FIG. 5 shows an illustrative structure of an inverse transform circuit in accord with the present invention. This inverse transform circuit is a counterpart circuit of the transform circuit of FIG. 2. That is, the spectral signal components of the respective bands, supplied to terminals 501, 502, are transformed by inverse orthogonal transform circuits 511, 512 associated with the respective frequency bands, and the signals of the respective bands are synthesized by a band synthesis filter 513. Meanwhile, the signal components of the respective bands, supplied to the terminals 501, 502, correspond to the output outputs of the signal component decoding circuit 402 except that the decoding circuit 402 has only one output, while an output is output at output terminal 404a.

A typical signal encoding method in the above-described encoder of FIG. 1 is now explained.

Figure 6:
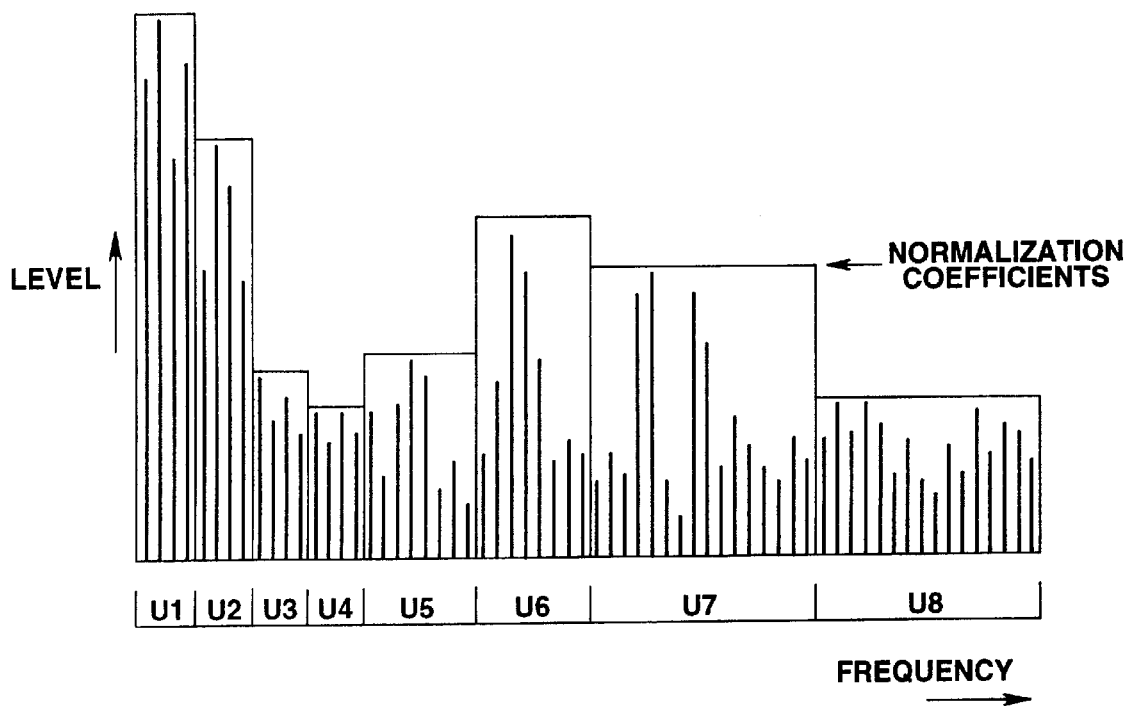
FIG. 6 illustrates an encoding unit.

FIG. 6 shows a conventional example of spectral signal components obtained by MDCT processing by the transform circuit of FIG. 2. In this figure, the level of the absolute values of the spectral signal components obtained by MDCT is shown converted to dB.

Referring to FIG. 6, the waveform signal has been transformed into 64 spectral signal components every pre-set time block. These spectral component signals are grouped in terms of eight pre-set bands U1 to U8 as units for normalization and quantization. These eight pre-set bands are termed encoding units. That is, these encoding units serve as units for encoding. The bandwidths of the encoding units are selected to be narrower and broader in the low and high frequency ranges, respectively, for taking the psychoacoustic characteristics of the human being into account for controlling the generation of the quantization noise in a manner matched to the characteristics of the human hearing system. The quantization precision can be varied from one encoding unit to another depending on the manner of distribution of the frequency components for suppressing deterioration in the sound quality to the smallest value possible for achieving psychoacoustically efficient encoding.

For reducing the quantization error in the encoding units, the normalization coefficients in the encoding units are desirably set for approximating the maximum absolute value of the spectral signal components in the encoding units. For $0 \leq D \leq 63$, for example, the normalization coefficient F is set as shown in the equation (1):

$$F = 2^{\frac{D-12}{3}} \quad (1)$$

so as to be designated by 6-bit codes representing D. Also, for $0 \leq B \leq 15$, it may be designated as shown by the equation (2):

$$M = 2^B - 1 \quad (2)$$

while a normalized quantized value m for a signal value (spectral signal component) v can assume an integer shown by the equation (3):

$$m(v, F, M) = \frac{v \times M}{F} \quad (3)$$

The quantization precision can be designated by a 4-bit code representing B.

If the normalized quantized value m is represented by a variable length code, the encoding efficiency can be increased. In general, in a spectral distribution of audio signals, the signal energy is concentrated in many cases in specified frequency components. In such cases, the quantized values obtained on normalizing and quantizing the respective spectral signal components are mostly distributed in a range close to zero. Therefore, the encoding efficiency may be improved by setting shorter codelengths for quantized values close to zero. FIGS. 7(A), (B) illustrate conventional examples of giving codes for setting codelengths for B=1 and for B=2, respectively. If a signal is a peak signal in which the signal energy is concentrated in specified frequency components, the quantization precision needs to be increased for such signal. The encoding efficiency is preferably increased for such signal for not degrading the sound quality.

Figure 8:
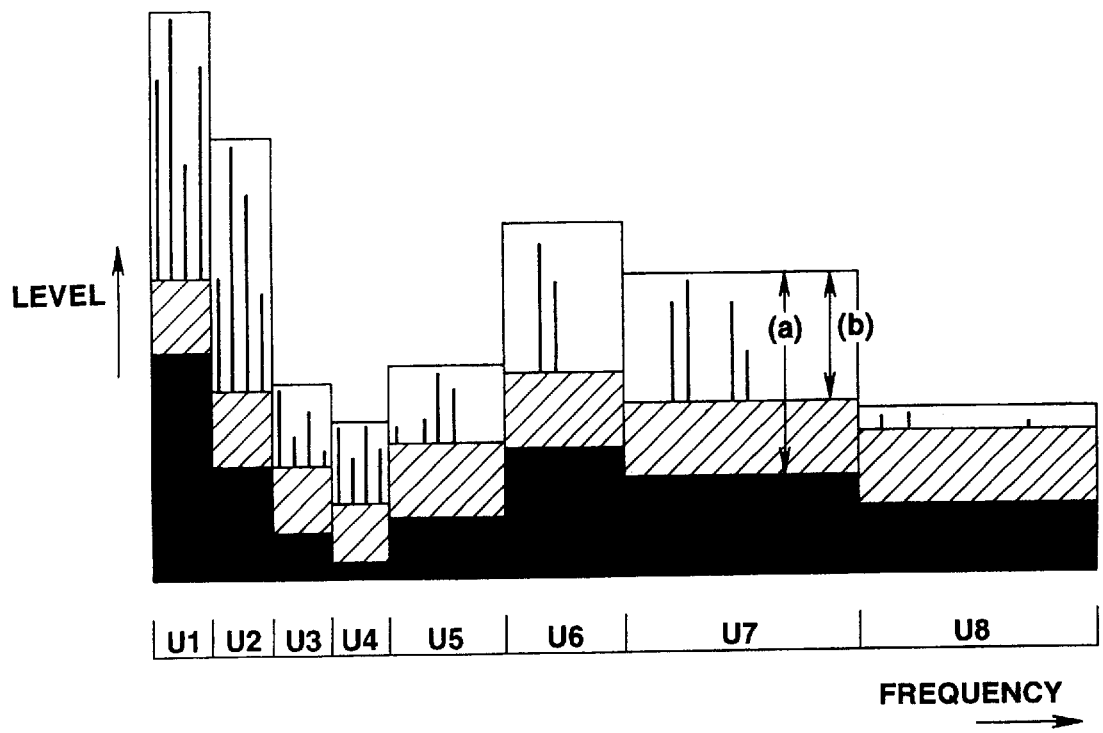
FIG. 8 illustrates typical setting for the initial value of quantization precision.

However, which quantization precision should be used in which encoding unit also differs with the signal compression ratio. FIG. 8 illustrates a conventional example of a method for setting the quantization precision. In this figure, an area in black denotes an ideal allowable noise level as found by minimum audible level or masking calculations. Thus, in the encoding unit U7, for example, bit allocation which realizes the SN ratio shown at (a) leads to realization of the ideal sound quality. However, in fact, the number of bits required in many cases for realization of this SN ratio is more than can be actually used. Therefore, bit allocation obtained by uniformly increasing the number of bits from the ideal allowable noise level, that is the bit allocation which will give the noise level shown shaded for the encoding unit U7, is actually performed for realization of the S/N ratio shown at (b) for the encoding unit U7.

Figure 9:
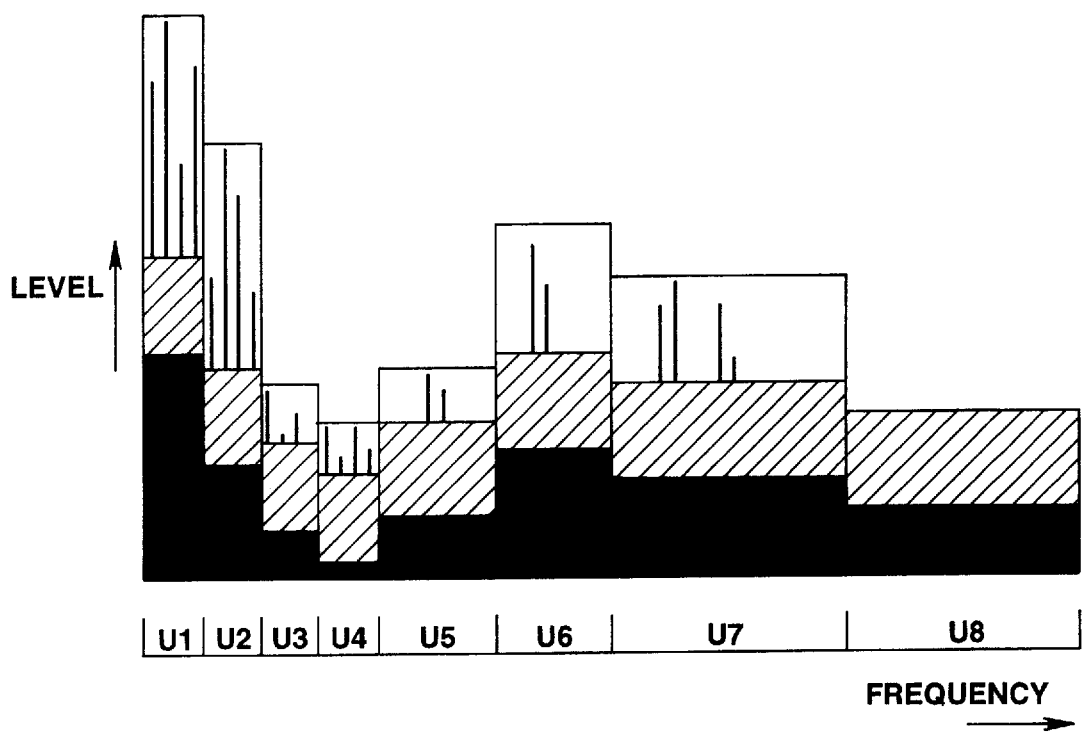
FIG. 9 illustrates bit allocation in case the compression ratio is raised further in setting the initial value of quantization precision.

As recognized in the present invention, FIG. 9 shows the manner of bit allocation for the case in which the compression ratio is increased further in the manner as shown in FIG. 8. In this case, no bits are allocated to the encoding unit U8. Such signal dropout for a specified band leads to a significant problem in connection with the sound quality. In particular, if signal components in a specified band appear or vanish depending on frames, the resulting sound becomes extremely harsh to the ear. Although it is possible to lower the quantization precision of other encoding units to allocate more bits to the encoding units in need of bits, depending on the state of bit allocation, it is difficult to cut the number of quantization steps significantly in case of a high compression ratio since then there is no sufficient allowance of quantization precision in the other encoding units.

For overcoming this problem, there is proposed a method for minimizing the problem in connection with the human hearing system while minimizing the reduction of the number of quantization steps in performing the encoding using the variable length codes, as disclosed in the above-mentioned United States, now U.S. Pat. No. 5,778,339.

Figure 10:
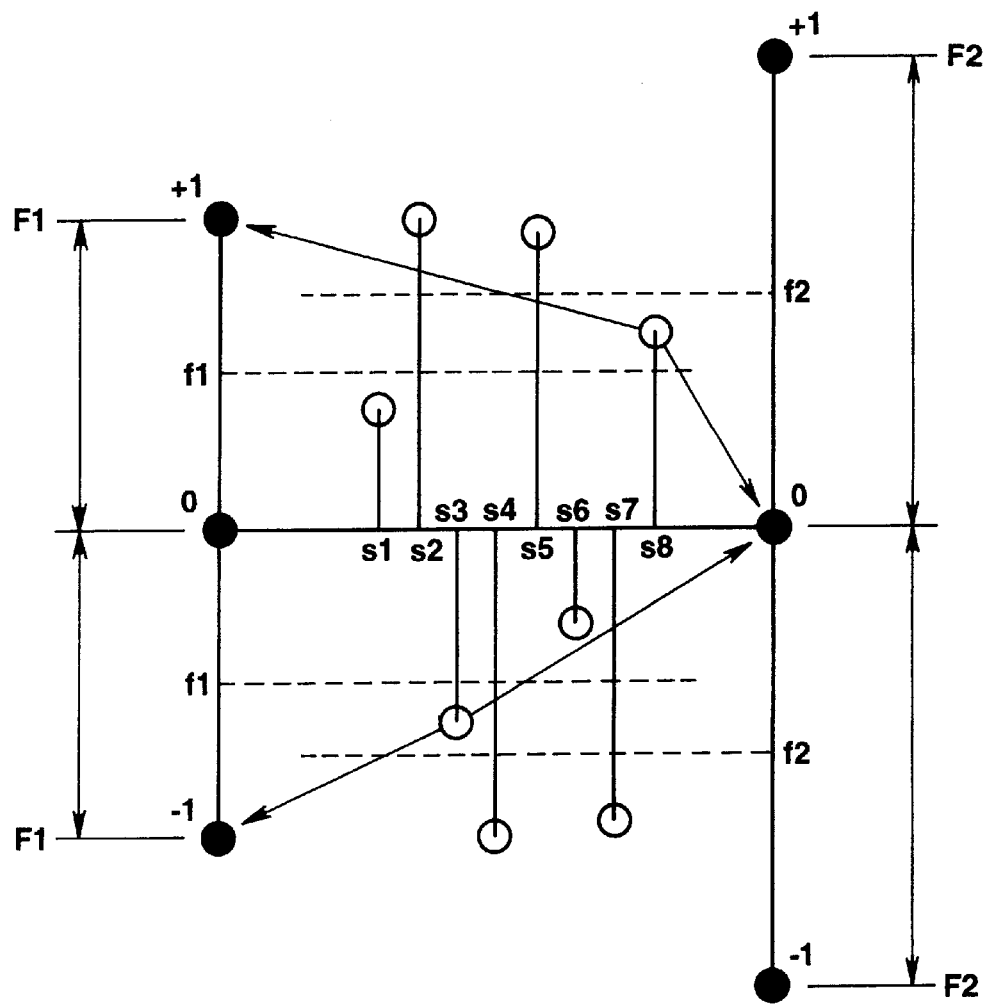
FIG. 10 illustrates how spectral signal components are normalized and quantized.

FIG. 10 illustrates an example of employing the method shown in the aforementioned United States, now U.S. Pat. No. 5,778,339. In this figure, there is shown the manner of normalizing and quantizing spectral signal components s1 to s8. The column (a) in FIG. 11 shows the results obtained by normalizing the spectral signal components using the normalization coefficients having a value F1 shown towards left in FIG. 10 and by quantizing the normalized spectral signal components in three stages. The column (b) in FIG. 11 shows the results obtained by normalizing the spectral signal components using the normalization coefficients having a value F2 shown towards right in FIG. 10 and by quantizing the normalized spectral signal components in three stages. That is, if the spectral signal components are normalized using the normalization coefficients having the value F1, the spectral signal components having the absolute values not larger than f1 in FIG. 10 are normalized to a value 0, while those having the absolute values larger than f1 are normalized to a value F1. Rephrasing, f1, is a signal level above which a signal component will be normalized to a quantized value $F_1$, and below which a signal component will be normalized to a quantized value 0. On the other hand, if the spectral signal components are normalized using the normalization coefficients having the value F2, the spectral signal components having the absolute values not larger than f2 in FIG. 10 are normalized to a value 0, while those having the absolute values larger than f2 are normalized to a value F2. Therefore, if the spectral signal components are normalized using the normalization coefficients having the value F1, the spectral signal components s1, s2, s3, s4, s5, s6, s7 and s8 are normalized to 0, +1, −1, −1, +1, 0, −1 and +1, respectively, as shown at (a) in FIG. 11. On the other hand, if the spectral signal components are normalized using the normalization coefficients having the value F2, the spectral signal components s1, s2, s3, s4, s5, s6, s7 and s8 are normalized to 0, +1, 0, −1, +1, 0, −1 and 0, respectively, as shown at (b) in FIG. 11.

If encoding is done as shown in column (a) in FIG. 11, the signal components having the quantized values +1, 0 and −1 are decoded by the decoder to F1, 0 and −F1, respectively. On the other hand, if encoding is done as shown in column (b) in FIG. 11, the signal components having the quantized values +1, 0 and −1 are decoded by the decoder to F2, 0 and −F2, respectively. The difference between the original signal components and the encoded and decoded spectral signal components is smaller if the signal components are normalized and quantized as shown in column (a) than if the signal components are normalized and quantized as shown in column (b) in FIG. 11. However, if the normalized and quantized values are encoded by the encoding method shown in FIG. 7(A), the ratio of the small-length codes becomes larger if the signal components are normalized and quantized as shown in column (b) than if the signal components are normalized and quantized as shown in column (a) in FIG. 11.

Thus, it is recognized in the present invention if the compression ratio becomes extremely high such that the number of usable bits is decreased, reduction in the number of bits may be realized in the above-described signal encoding method by normalizing the signal components using the normalization coefficient having the value of F2 and subsequently encoding the normalized components as shown in column (b) in FIG. 11 rather than by normalizing the signal components using the normalization coefficients having the value of F1 and subsequently encoding the normalized components as shown in column (a) in FIG. 11. The result is that there is no risk of disappearance of the signal components of a special frequency band.

The above-described bit allocation processing can be resolved in two stages. The first stage is the step of setting the initial value of quantization precision for setting which quantization precision is to be provided for each encoding unit, while the second stage is the step of adjusting the quantization precision for adjusting the bit allocation so as to observe the limitation on the total number of usable bits.

The first and second stages of the present invention will be explained in this order.

As a preamble to describing the first stage of the present invention, two conventional methods are first discussed each having shortcomings which accent the advantages of the present invention. A conventional method for setting the initial value of quantization precision has been to compute the masking quantity based on the signal energy and the normalization coefficient related therewith for each encoding unit as set for approximating the critical band and to set the initial value of quantization precision for each encoding unit based on the relation between a resulting minimum audibility level and the normalization coefficient. However, since this method does not take into account the manner of distribution of signal components in the encoding units, properties of signals in the encoding units, in particular, psychoacoustically critical properties of the signals in the encoding units as to whether these signals are peak signals exhibiting sharply changing spectral distribution or noisy signals exhibiting flat spectral distribution, are not properly reflected in setting the quantization precision. In particular, if the compression ratio is high, sufficient signal quality cannot be maintained.

For enabling more precise masking calculations, there is also known a method of finely extracting peak signal components from the spectral signal components, including separately finding the masking quantity by the peak signal components and by the other signal components based on the respective masking characteristics, and synthesizing the masking quantities to find the minimum audibility level for setting the initial value of the quantization precision from the relation between the resulting minimum audibility level and the normalization coefficients. This method, however, has a drawback that the processing becomes complex and hence the hardware for encoding becomes bulky in size.

Therefore, in a first stage bit allocation according to the present invention, the initial value of the quantization precision is adapted to be set for reflecting the manner of distribution of the signal components in the encoding units by a simplified operation. Specifically, the initial value of the quantization precision is set in accordance with an index as found from a quantity determined on the basis of a unit (termed herein a "component unit") set fixedly with a bandwidth narrower than the bandwidth of the above-described encoding unit. The term fixedly herein means that the unit is set fixedly to the extent that the signal portion exhibits constant properties. Thus, if the manner of setting of the component unit differs between a transient signal portion (that is, peak signal components) and the other stationary signal portion (that is, noisy signal portion), such setting manner is comprised within the scope of the present invention. On the other hand, the bandwidth of the component unit is set within the critical bandwidth which takes the psychoacoustic characteristics of the human being into account and is selected to be narrower towards the lower frequency range. Therefore, if the bandwidth of the component unit is strictly not narrower than the bandwidth of the encoding unit, such case is comprised within the scope of the present invention. The method of extracting and separating the peak signal components based on the component unit as a unit will be explained subsequently.

Figure 12:
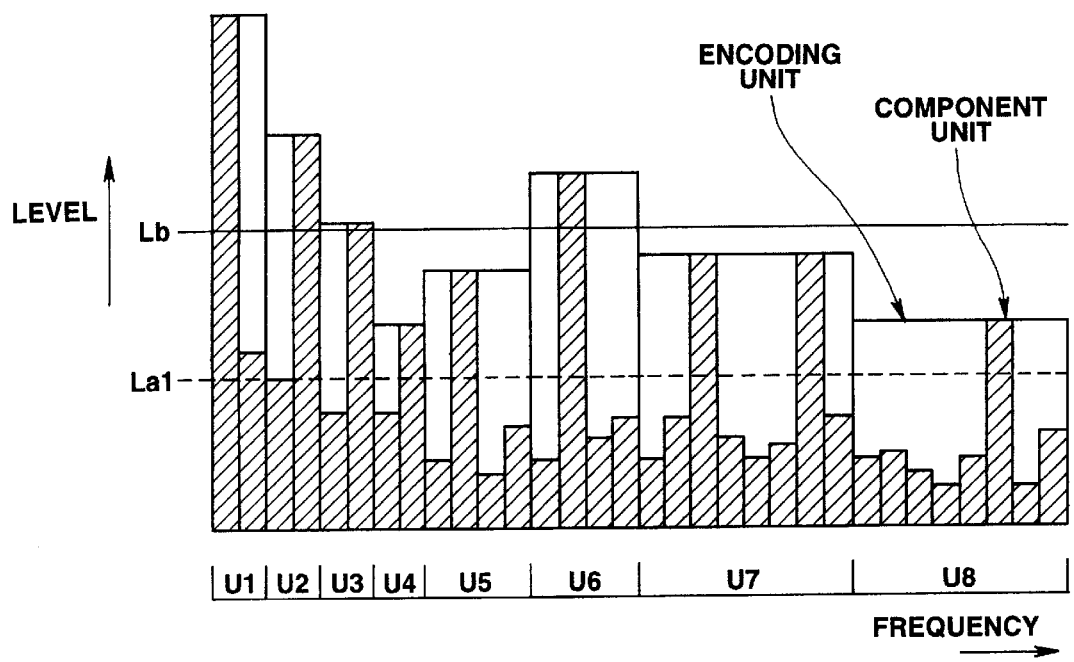
FIG. 12 illustrates the normalization coefficients of encoding units of signals containing noisy components and the normalization coefficients of component units.
Figure 13:
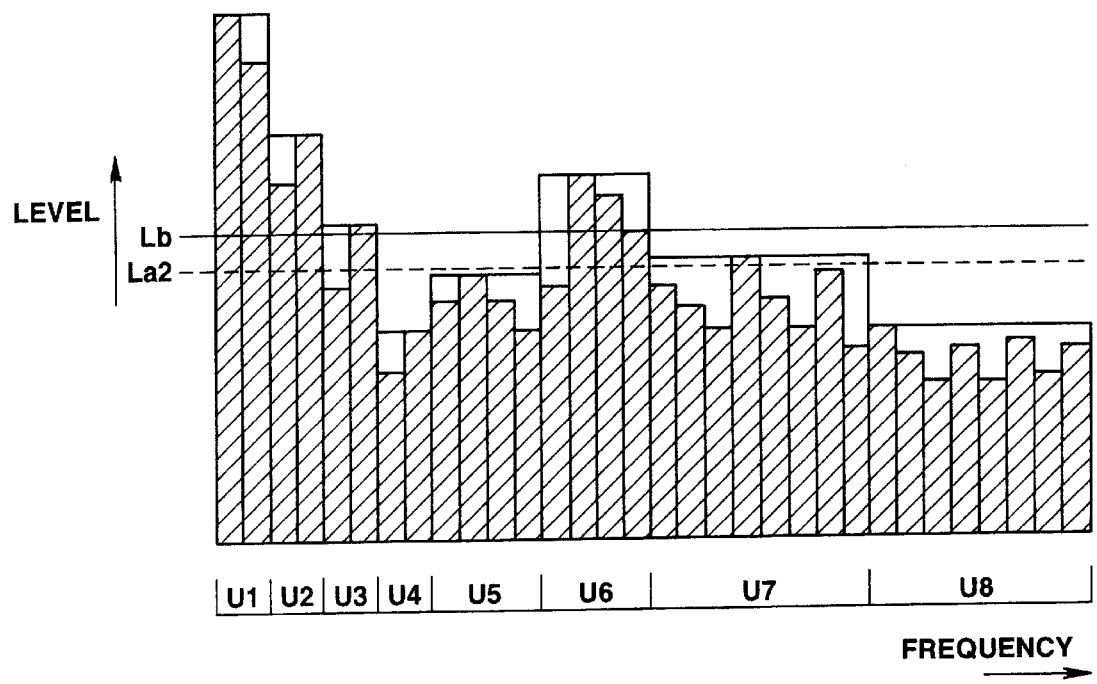
FIG. 13 illustrates the normalization coefficients of encoding units of signals containing peak components and the normalization coefficients of component units.

FIGS. 12 and 13 illustrate the effect of processing for bit allocation for the first stage of the present invention just described above. In these figures, the blocks shown shaded denote component units. The ordinate denotes the level of the normalization coefficients of the encoding units and the component units. Although the spectral signal components are not normalized in the component units, the numerical figures approximating the maximum absolute value of the spectral signal components of the component units are termed normalization coefficients as in the case of the encoding units.

In the examples of FIGS. 12 and 13, the normalization coefficients D of the encoding units corresponding to D of the equation (1) are all the same, so that the average values $L_b$ thereof are coincident with one another. Conversely, the average values $L_a$ of the normalization coefficients D of the component units become $L_{a1}$ and $L_{a2}$ in the case of the example of FIG. 12 containing peak signal components and in the case of the example of FIG. 13 containing noisy signal components, respectively, with $L_{a1}$ becoming smaller than $L_{a2}$.

Therefore, if $b_1$ is a constant and $r_{1,i}$ is a constant fixed for each i in the equation (4):

$$B(i) = \frac{D(i) - L_b}{r_{1,i}} + b_1 \quad (4)$$

wherein B(i) is the initial value of the quantization precision computed for the ith encoding unit; D(i) is a normalization coefficient for the ith encoding unit; $L_b$ is a constant set based on an average value of the normalization coefficients D(i) of the second band units; $r_{1,i}$ is a constant set for each second band unit; and $b_1$ is a constant, in accordance with the method known up to now, and the initial value of the quantization precision is set for approximating the equation (4), then the two values may be set to the same value in the cases of FIGS. 12 and 13.

Conversely, if a quantity fixed for each component unit, as in the bit allocation processing for the first stage as described above, in this case $L_a$, is used, $b_2$ is set to a constant, and $r_{2,i}$ is set to a constant fixed for each i, in the equation (5):

$$B(i) = \frac{D(i) - L_a}{r_{2,i}} + b_2 \quad (5)$$

wherein B(i) is the initial value of the quantization precision computed for the ith encoding unit; D(i) is a normalization coefficient for the ith encoding unit; $L_a$ is a constant based on an average value of the normalization coefficients of the first band units; $r_{2,i}$ is a constant set for each encoding unit; and $b_2$ is a constant, then initial value can be set to different values for the examples of FIGS. 12 and 13.

That is, as may be seen easily from FIGS. 12 and 13, the value of $L_a$ is smaller for the peak signal components as shown in FIG. 12 than for the noisy signal components as shown in FIG. 13, even if the value of $L_b$ of the two signal components remains the same. If the equation (5) is used at this time, the initial value for quantization precision is set to a higher value for the encoding unit shown in FIG. 12 than for the encoding unit shown in FIG. 13. This is optimally adapted to the fact that, for preventing sound quality deterioration, higher quantization precision needs be given to the peak components.

If a codelength longer than that allocated to signal components having a quantized value of zero is allocated to signal components having quantized values other than zero, as shown in the table of FIG. 7, and higher quantization precision than that given to signal components other than peak components is given to the peak components, a smaller number of bits required for encoding suffices, and it can be said that the above-described first stage bit allocation leads to setting of a better initial value of quantization precision. In addition, since the processing is done in the above-described first stage bit allocation in terms of the component unit composed of plural spectral signal components grouped together as a unit, the initial value for the quantization precision can be set with a smaller processing volume than in the case of computing the positions of the peak signal components on the basis of the spectral components as units for achieving accurate masking calculations.

Although the equation (5) shows an example of employing an index as found from a quantity as found on the component unit basis in setting the initial value of quantization precision (herein $L_a$), the processing method taking into account band-to-band masking can also be used for calculating B(i) of the equation (5). The initial value for quantization precision can also be set in such a manner as to preclude dropout of signal components of specified bands.

The processing method for adjusting bit allocation for limiting the bits to be within the total number of usable bits, by way of the second-stage bit allocation of the present invention, is now explained.

If, in encoding quantized spectral signal components, variable length codes are used, efficient encoding can be achieved, as discussed above. If the variable length codes are used, the number of required bits cannot be found if only the quantization precision is specified, in distinction from the case of fixed length coding. It is therefore necessary to check how many bits the code for each spectral signal component is made up of in order to find the respective sum values.

The result is that, inconveniently, not only the processing volume for finding the number of bits used in each encoding bit is increased, but also the number of loops required for adjusting the allocation of bits used in each encoding unit in case the quantization precision is changed.

Thus, in an adjustment operation according to the present invention for second-stage bit allocation, shown below, the number of times of bit allocation adjustment operations is decreased by previously adjusting the bit allocation taking into account the overall balance based on an estimated number of bits required in each encoding unit. An estimation of the number of bits required in each encoding unit can be made in accordance with the equation (6):

$$P(i) = W \times J \times H \quad (6)$$

where W is a simple average value of the variable length codelength corresponding to the quantization precision specified for each encoding unit, J is the number of component units contained in each encoding unit and the H is the number of spectral components in each component unit.

The numbers of bits use d in the encoding units can n be estimated more effectively by exploiting the normalization coefficients of the component units, as now explained.

Figure 14:
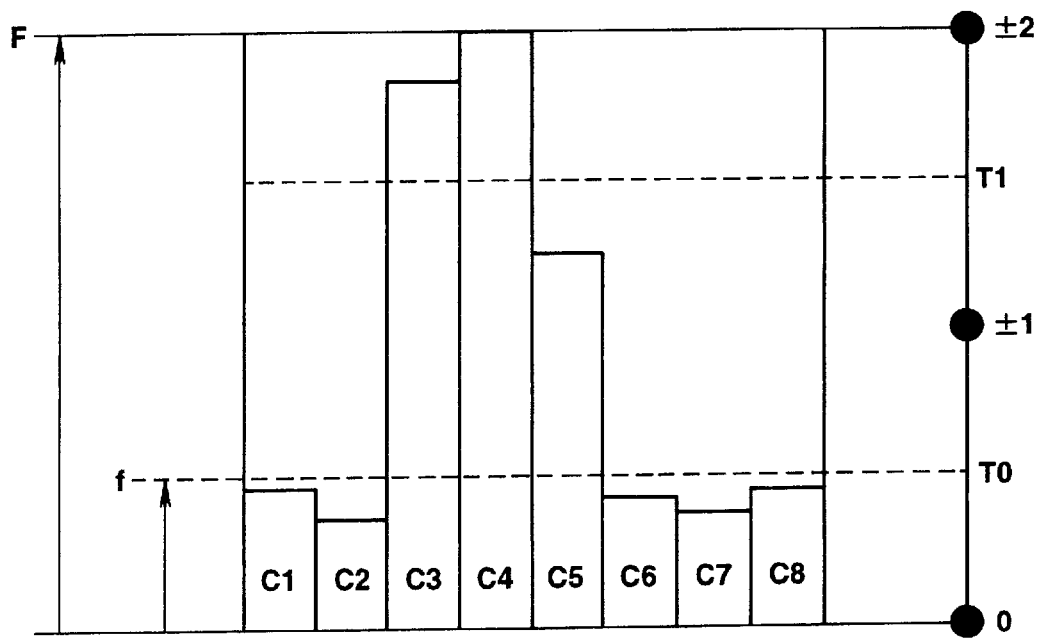
FIG. 14 illustrates processing for bit allocation adjustment employing the component units.

FIG. 14 shows an encoding unit made up of eight component units C1 to C8. Shown on the left-hand and right-hand sides of FIG. 14 a re the normalization coefficient of a level F for this encoding unit and the absolute value level in case of quantization from −2 to +2.

In this figure, T0 and T1 denote boundary values in case the spectral signal components are quantized to respective quantized values. Therefore, the estimated values of the number of bits required for encoding the spectral signal components quantized in the encoding unit may be found in accordance with the equation (7):

$$P(i) = (W_0 \times J_0 + W_1 \times J_1) \times H \quad (7)$$

where W0 is a code length for the quantized value 0, J0 is the number of component units with the normalization coefficient less than f, W1 is the simple average value of the variable length codelengths for the quantized value other than zero, $J_1$ is the number of the component units with the normalization coefficient not less than f and H is the number of spectral signal components contained in each component unit.

With the equation (7), estimation may be done with higher precision than with the estimated value of the equation (6).

It should be noted that S(i) can be found by the equation (8) from the estimated value P(i) of each encoding unit as found by the above method and the total number of usable bits G in accordance with the equation (8):

$$S(i) = G - \sum_{j=i+1}^{j=N} P(j) \qquad (8)$$

Meanwhile, S(i) is a value, approximated by estimation, of the total number of bits T(i) which has actually been used at a time point of termination of allocation up to the ith encoding unit in case bit allocation is done from the low range side of the encoding unit. This value S(i) is used in processing bit allocation adjustment as later explained. In the following equation (9):

$$T(i) = \sum_{j=1}^{i} Q(j) \qquad (9)$$

Q(i) is the number of bits actually used in the encoding unit in encoding the quantized spectral signal components.

Figure 15:
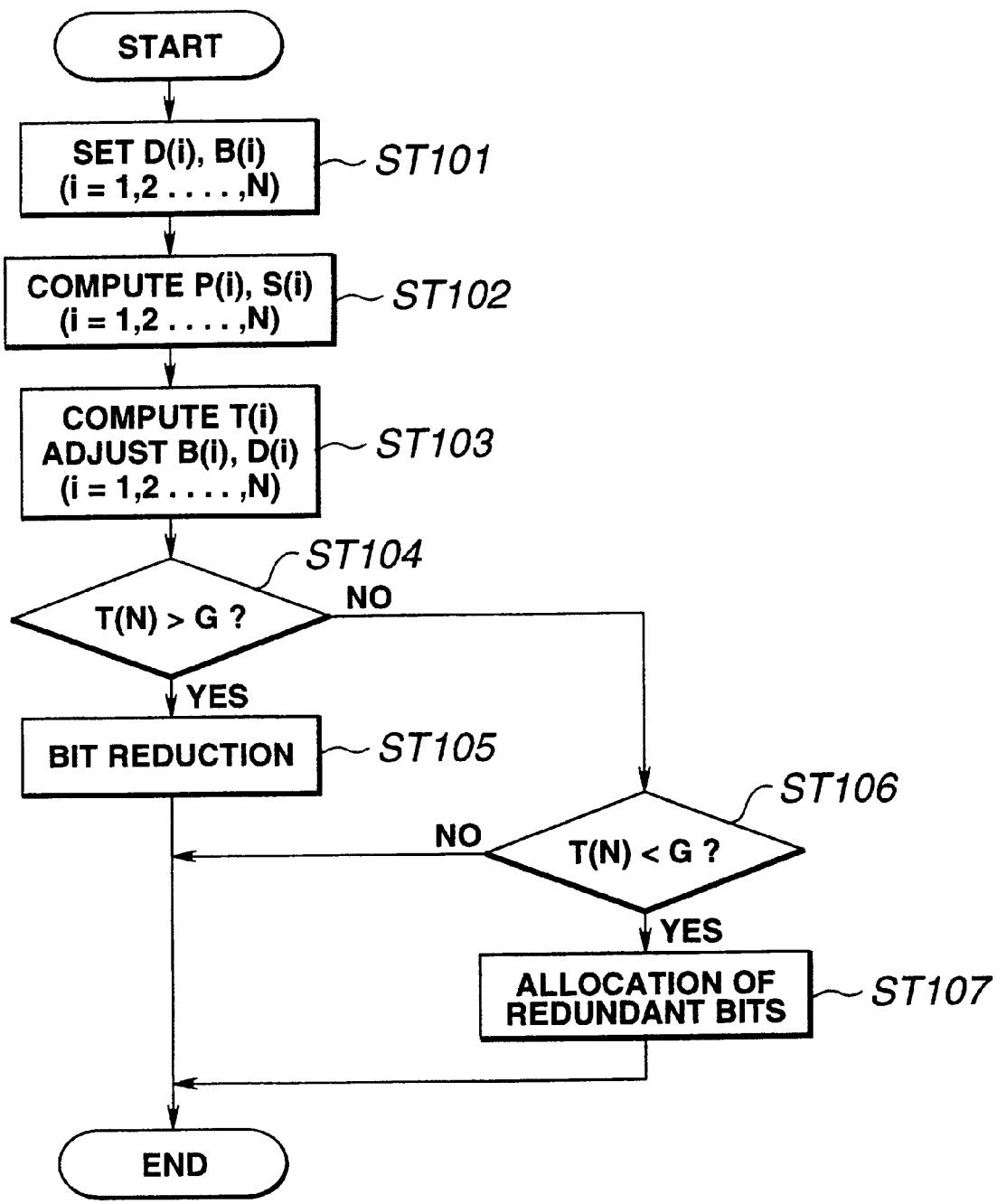
FIG. 15 is a flowchart showing the processing flow of bit allocation adjustment processing employing the component units.

FIG. 15 shows, in a flow chart, an illustrative processing flow of bit allocation at the time of the bit allocation adjustment described above.

Referring to FIG. 15, the normalization coefficients D(i) and the quantization precision information B(i) in each encoding unit are found at step 101 based on the above-described method. At the next step 102, an estimated value P(i) of the amount of bits used in each encoding unit is found by the method based on the equation (7), while the above value S(i) is found in accordance with the equation (8). At the next step 103, bit allocation adjustment is done while the value T(i) is found by processing which will be explained subsequently in detail. At step 104, it is checked whether or not the total number of bits used T(N) exceeds the total number of usable bits G. If the result is YES, that is if there are redundant bits, processing transfers to step 105 in order to perform bit reduction processing. This bit reduction processing can be performed by limiting the bandwidth until the total number of usable bits becomes smaller than G. Although the sound quality is degraded by this bit reduction, such sound quality degradation can be practically neglected since the possibility of the result of decision at step 104 becoming affirmative can be lowered by exploiting the method of the present invention. In addition to band limitation, such a method may be used in which the quantization precision is lowered beginning from the high range side encoding unit so that each encoding unit will have at least three stages (−1, 0, +1) of quantization steps. If the result of decision at step 104 is NO, processing transfers to step 106 in order to check whether or not there are any redundant bits. If there are redundant bits, the redundant bits are additionally allocated at step 107. This additional allocation may be performed from the psychoacoustically crucial low-range side.

Figure 16:
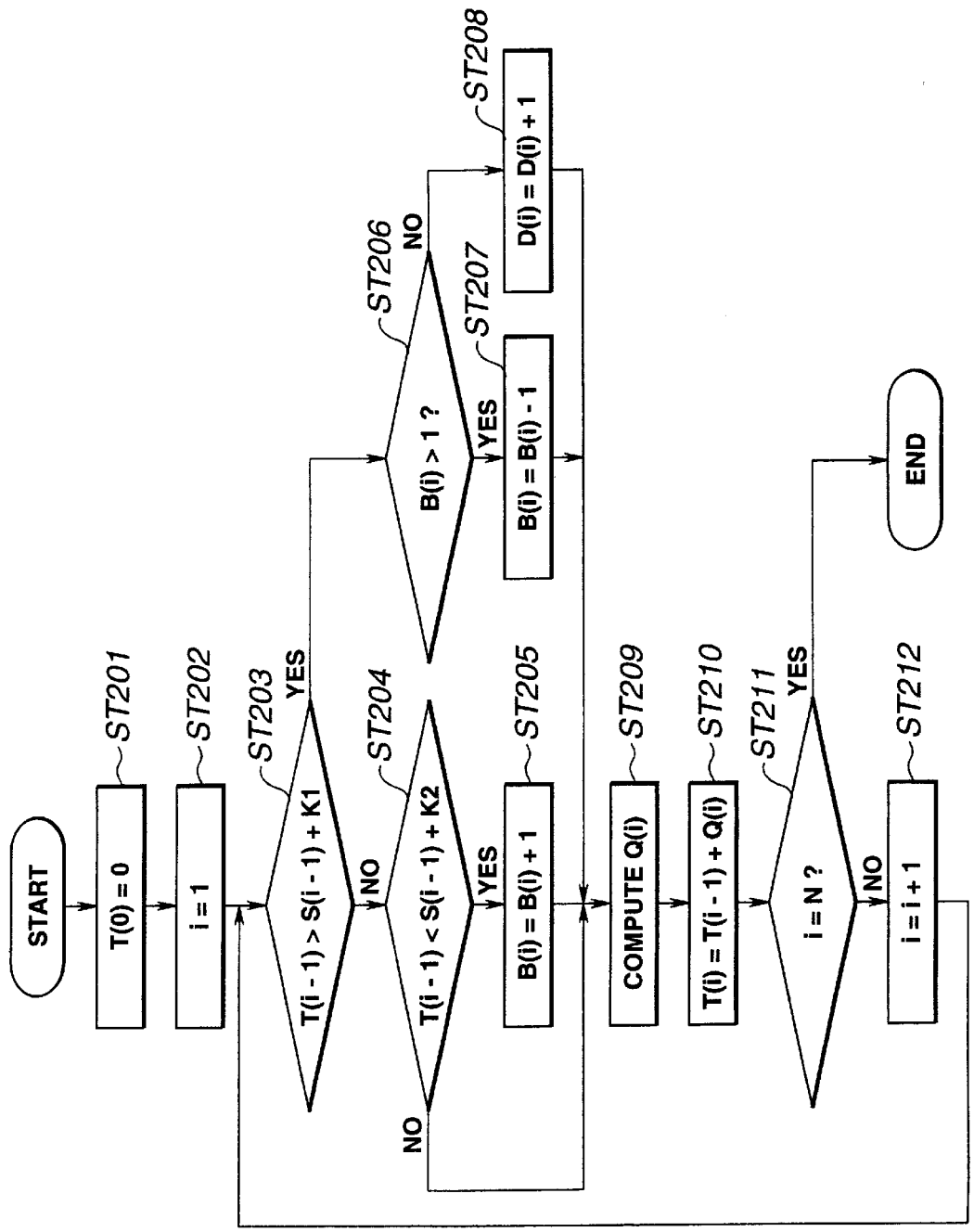
FIG. 16 is a flowchart for illustrating the processing of step 103 of FIG. 15 in detail.

FIG. 16 shows an illustrative processing showing the processing contents of step 103 of FIG. 5 in more detail.

First, at steps 201 and 202, setting of T(0)=0 and i=1 is made by way of initialization. Processing then transfers to step 203 where processing proceeds to step 206 if T(i−1) is larger than S(i−1)+K1. At step 206, it is checked whether or not the value of B(i) is larger than 1. If the value of B(i) is larger than 1, the quantization step can be lowered without causing dropout of spectral information. Therefore, processing transfers to step 207 to lower the quantization step by one before proceeding to step 209. If T(i−1) is not larger than S(i−1)+K1 at step 203, processing transfers to step 204. At step 204, it is checked whether or not T(i−1) is smaller than S(i−1)+K2, where K2 is a negative integer. If the result of the check is YES, processing transfers to step 205 in order to raise the quantization step by one before proceeding to step 209. If otherwise, processing transfers directly to step 209. At step 209, the number of bits Q(i) required actually in the encoding unit is calculated. At the next step 210, T(i) is found from T(i−1) and Q(i). At step 211, it is checked whether or not the encoding unit currently processed is the last encoding unit. If the result is YES, processing is terminated. If the encoding unit is not the last encoding unit, the value of i is incremented by one at step 212 before reverting to step 203.

In the above description, K1 and K2 are assumed to be of the same value for all values of i. However, K1 and K2 may also be varied depending on the value of i. For example, if, towards the end of the bit allocation adjustment operations, the number of actually required bits C(i) becomes significantly larger than the estimated number of bits P(i) for the encoding unit, the probability of a bit shortage occurring ultimately becomes higher. Thus, for the encoding units towards the end, the value of K1 may be of a negative value. By so doing, the probability of the result of decision at step 204 being affirmative may be lowered.

In the foregoing description, bit adjustment processing is performed beginning from the low range side for simplifying the processing. However, the bit adjustment processing may also be performed in order of the decreasing values of the normalization coefficients. By so doing, if bit shortage occurs towards the end of the bit adjustment, the effect of sound quality degradation caused by the lowering of the quantization precision information on the hearing sense may be minimized.

Also, in the foregoing description, the method for reducing the number of bits is divided in two depending on the value of B(i). It is however possible to use larger values of the normalization coefficients in either case without regard to the value of B(i). The method of reducing the number of bits may include a method of enlarging the scope of quantization to codes of shorter codelengths in addition to the method of enlarging the normalization coefficients.

Figure 17:
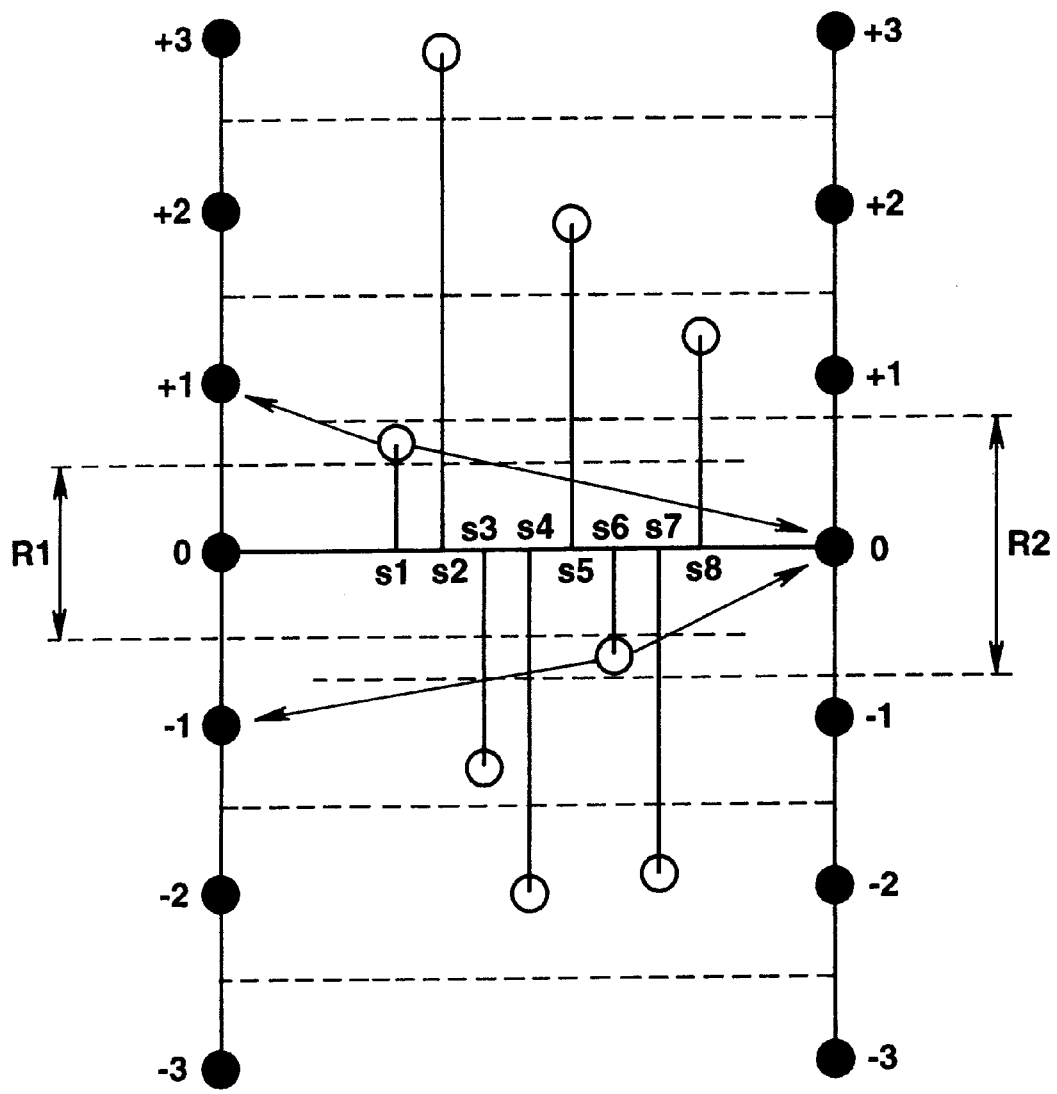
FIG. 17 illustrates quantization for reducing the number of bits by varying the range of quantization to 0 with short codelength.

FIG. 17 shows, as an example of the method of the present invention for reducing the number of bits by enlarging the scope of quantization to a shorter codelength, the effect derived from enlarging the scope of quantization to 0 as a code of shorter codelength from R1 to R2. That is, in FIG. 17, the ranges R1, R2 of values quantized to 0, to which the shorter codelength is afforded in the present embodiment, differ between the quantization method shown towards the left and that shown towards the right. With the quantization method shown towards the right of FIG. 17, employing R2 as the range of the value quantized to 0, the quantization noise becomes larger than with the quantization method shown towards the left of FIG. 17, employing R1. However, with the quantization method shown towards the right in FIG. 17, the ratio of the spectral signal components, for which the quantized value with a shorter codelength becomes zero, becomes higher, so that encoding can be done with a smaller number of bits. With the present method, the psychoacoustically crucial spectral signal components of larger amplitudes are decoded to the same spectral signal components which are the same as those minimizing the quantization noise, and sound quality degradation can be prevented effectively. If, with the present method, there are a sufficient number of usable bits, it is desirable to minimize the quantization noise in each encoding unit. Therefore, sound quality degradation can be minimized by performing the above processing after first allocating the bits.

As will become clear from the foregoing description of the present invention, the increase or decrease of bit allocation is adjusted based on the estimated value, so that adjustment to nearly optimum quantization precision may be achieved under the given total number of bits even with a single loop. In particular, if the estimated value is calculated using the normalization coefficients of the component unit, an estimated value of high precision can be obtained, so that adjustment closer to optimum adjustment can be achieved.

The method for extracting and separating peak signal components based on the use of the component unit is now explained.

Figure 18:
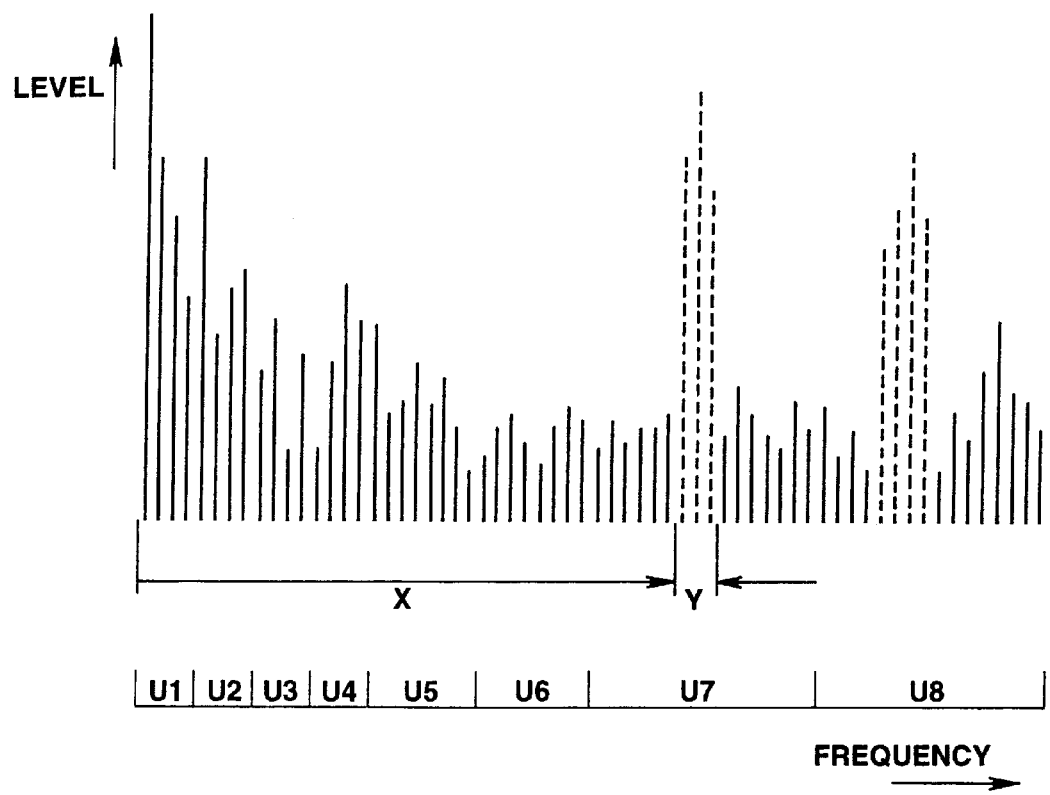
FIG. 18 illustrates extraction and separation of peak signal components.

FIG. 18 illustrates extraction and separation of peak signal components according to the present invention. The peak signal components, shown by broken lines in FIG. 18, need to be quantized with high precision for maintaining the sound quality. However, if the totality of the spectral signal components in the encoding unit containing the peak signal components are encoded with high precision with longer bit lengths, the encoding efficiency is lowered. It is therefore preferred to separate these peak components for encoding. The method of separating these peak signal components for encoding is proposed in the aforementioned U.S. Pat. No. 5,717,821.

Figure 19:
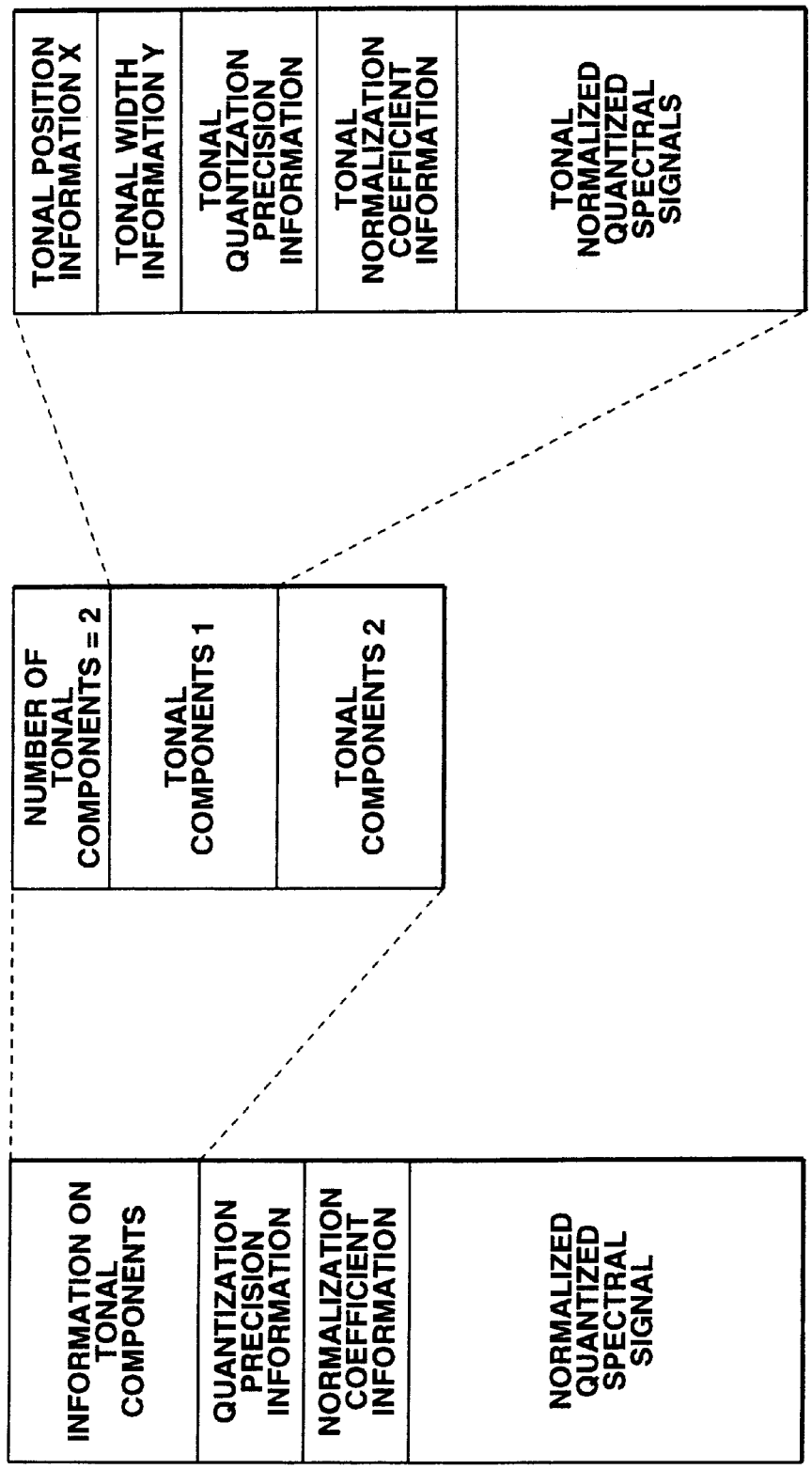
FIG. 19 illustrates a typical method for recording the codes obtained in accordance with the present invention.

FIG. 19 shows an example of recording the separated peak signal components on the recording medium in accord with the present invention. In the example of FIG. 19, the peak component information as the information concerning the peak signal components is recorded in addition to the quantization precision information and normalization coefficients information for reproducing the spectral signal components encoded from one encoding unit to another, and the normalized and quantized spectral signal components. The peak component information of the present example includes two peak signal components, each having the quantization precision information and the normalization coefficient information for the peak signal component (termed the peak quantization precision information and the peak normalization coefficient information, respectively) and the normalized and quantized peak spectral signal components (termed normalized and quantized spectral signals, respectively). In addition, the peak component includes information including the position information of the peak signal components denoting X in FIG. 18 (peak position information) and the information on the width of the peak signal component denoting Y in FIG. 18, that is the information on the number of the peak signal components (peak width information). These, however, are merely illustrative and, as the method of encoding the peak signal components, the encoding method with higher efficiency, such as is shown in the above-mentioned U.S. Pat. No. 5,717,821, has been proposed. However, since the information such as the peak position information specifying the position of the peak signal components is also required for encoding the peak signal components, it is also possible to separate the peak signal components only on the high frequency side having broader bandwidths of the encoding units.

In separating the peak signal components, it is stated in the aforementioned U.S. Pat. No. 5,717,821 to check whether or not each spectral signal component represents the locally maximum component and whether or not the signal energy is locally concentrated in the spectral signal component combined with the neighboring spectral signal components. This method includes judgment processing for respective spectral signal components, so that the processing volume is occasionally increased to some extent.

For enabling peak signal components to be extracted by simpler processing by the present embodiment, the component units, as candidates for extraction of peak signal components, are first extracted, and part or all of the extracted component units are selected as being component units made up of the peak components. Alternatively, the peak signal components are extracted from the respective spectral signal components contained in the component units for extracting and separating the peak signal components by a smaller processing volume.

Figure 20:
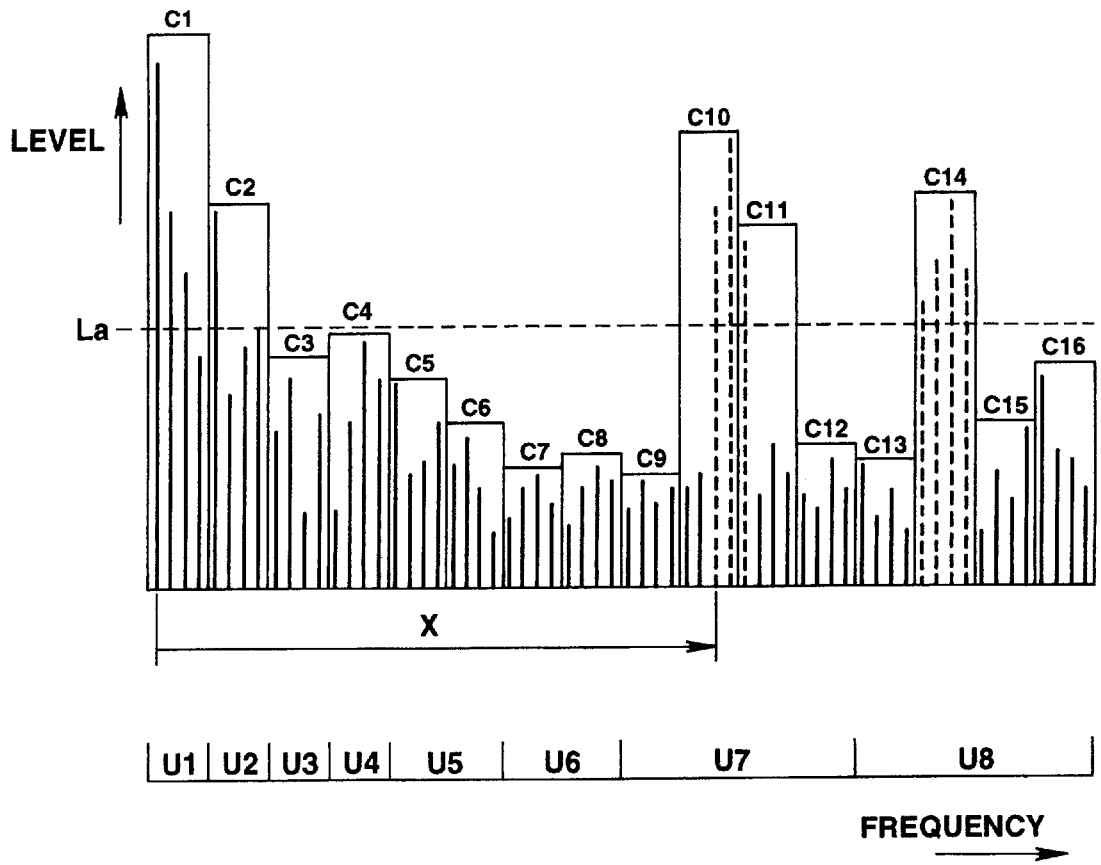
FIG. 20 illustrates simplified extraction and separation of the peak signal components.

FIG. 20 illustrates a method of the present invention for extracting the peak signal components described above. In the present embodiment, the peak signal components are extracted and separated only from the high frequency side. In this figure, $L_a$ is an average value of the normalization coefficients D of the component units. The component units located on the higher side than the encoding unit U4 and the normalization coefficients D of which are larger than $L_a$ described above, that is component units C10, C11 and C14, are used as candidates for the component units containing peak signal components.

For simplifying the processing, all of the spectral signal components contained in these candidate component units may be separated and encoded as peak signal components. However, if two neighboring component units have been selected as candidates, the probability is high that a group of the peak signal components astride these two component units have been selected as being the peak signal components contained in both of these two component units. In such case, a large number of bits are allocated to signal components other than the peak signal components contained in these component units. The illustrative processing shown for example in FIG. 21 may be used for processing the peak signal components lying astride these two component units in a unified manner for raising the encoding efficiency.

Figure 21:
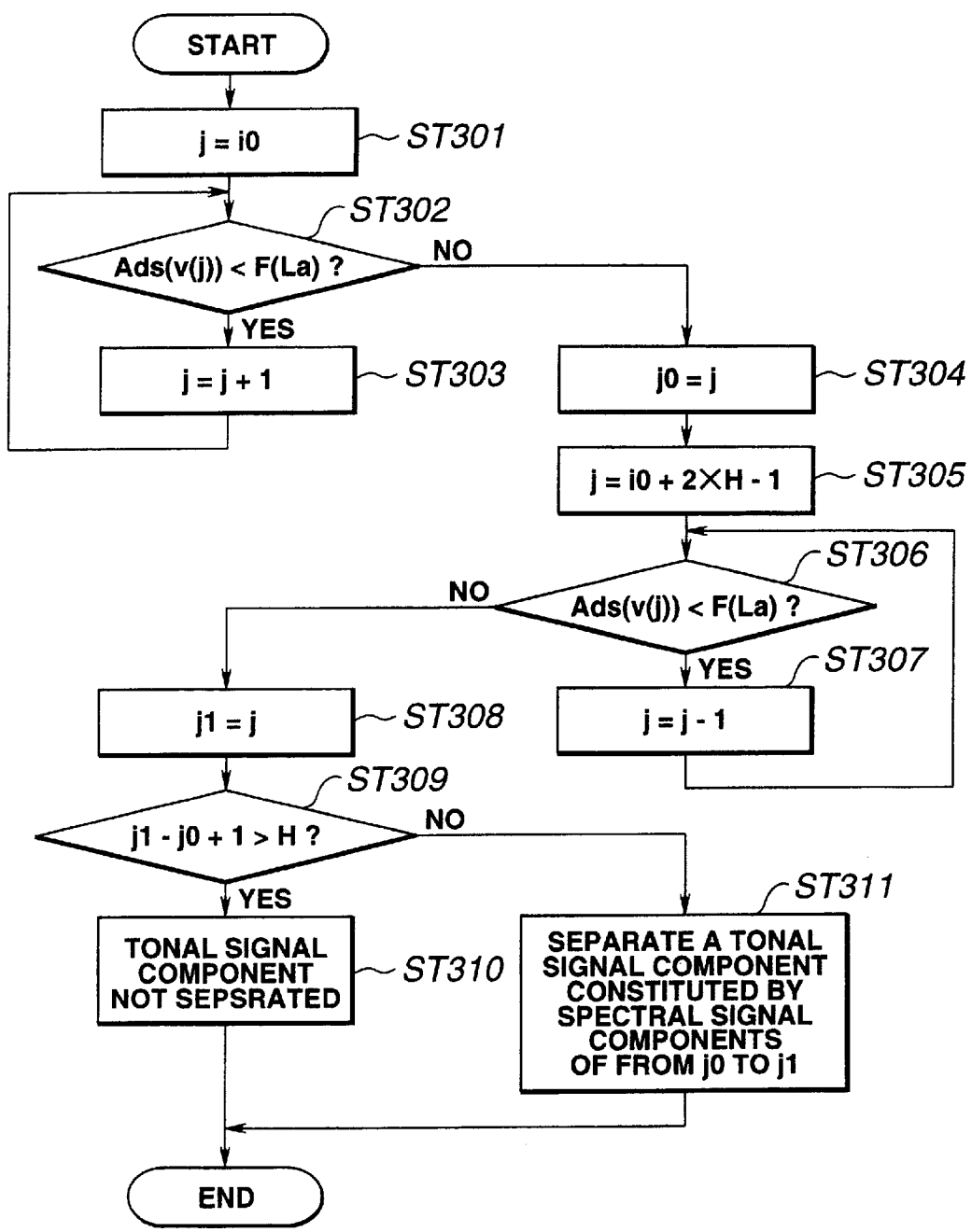
FIG. 21 is a flowchart showing the processing flow of simplified extraction and separation of the peak signal components.

In an illustration of processing according to the present invention, shown in FIG. 21, the number of the lowermost side spectral component io contained in the two component units is set as j at step 301. Then at step 302, it is checked whether or not the absolute value of the amplitude of the spectral component having the number j is smaller than the absolute amplitude value $F(l_a)$ corresponding to $L_a$. If the result is YES, processing transfers to step 303 where the value of j is incremented by one before processing reverts to step 302. If the result of check at step 302 is NO, processing transfers to step 304 where iO is set as j. Then, processing transfers to step 305 where the number of the spectral component of the highest frequency contained in the two component units iO+2H−1, where H is the number of the spectral signal components contained in the component units, is set as j. Then, at step 306, it is checked whether or not the absolute value of the amplitude of the spectral component having the number j is smaller than absolute amplitude value $F(l_a)$ corresponding to $L_a$. If the result of the check at step 306 is YES, processing transfers to step 307 where the value of j is decremented by one before processing reverts to step 306. If the result of the check at step 306 is NO, processing transfers to step 308 where j1 is set as j. It is then checked at step 309 whether or not the bandwidth from j0 to j1 is wider than H. If the result of the check at step 309 is YES, processing transfers to step 310 where it is determined that the peak signal components are not separated at this step. If the result of the check at step 309 is NO, processing transfers to step 311 where a peak signal component with the bandwidth from j0 to j1 is separated. It is noted that, while it is determined that, if the bandwidth is larger than H, peak components are not separated, the reference bandwidth may be set to a value other than H. If the result of the check at step 309 is YES, the two component units can be extracted and separated as being peak signal components. It is also possible to separate H spectral signal components from j0 to j0+H−1 as being peak signal components.

In the embodiment of the present invention shown in FIG. 20, the width of the peak signal components lying astride two component units is narrower than the width of the component unit, these peak signal components being extracted in the course of the processing of the present invention illustrated in FIG. 21. If a lone component unit has been extracted as a candidate of a component unit containing a peak signal component, processing similar to that of FIG. 1 is performed on this lone component unit for enabling the peak signal components of narrower widths to be extracted and separated from this component unit.

In the aforementioned U.S. Pat. No. 5,680,130, there is disclosed a method for grouping the peak signal components in accordance with the width of the peak signal component (number of constituent spectral signal components) for raising the encoding efficiency. If this method is used, the number of the constituent spectral signal components of the peak signal components in their entirety may be matched to the number of the constituent spectral signal components of the component unit for raising the efficiency and simplifying the operation. The case of matching the number of the constituent spectral signal components of the peak signal components in their entirety to the number of the constituent spectral signal components of the component unit, inclusive of the case of extracting a group of the peak signal components from two component units, is naturally comprised within the method of the present invention.

If there exist three or more consecutive component units exceeding $L_a$, the probability is high that the distribution of the spectral signal components be planar. In such case, it is possible to perform extraction of the peak signal components on the proviso that these component units be not separated as the peak signal components.

It is seen from above that the above-described method for extracting and separating the peak signal components leads to extraction of the peak signal components by a simpler operation.

The above-described signal encoding methods according to the present invention have many features in common, for example, using normalization coefficients found from one component unit to another. In such case, processing can be carried out efficiently by combining two or more of the processing encoding methods.

The foregoing description has been made of an illustrative structure employing signals filtered by a band-splitting filter and orthogonally transformed by MDCT, or signals inverse orthogonally transformed by inverse MDCT (IMDCT) as band-synthesizing means and subsequently filtered by a band-synthesis filter. Of course, the signals may be directly processed with MDCT or IMDCT without employing a band-splitting filter or a band-synthesis filter. The orthogonal transform may also be DFT or DCT in place of MDCT.

Although the foregoing description has been made of the case of using an acoustic waveform signals, the method of the present invention may also be applied to other sorts of signals, such as, for example, video signals. However, if the audio signals are orthogonally transformed, such as MDCTed, to provide a signal converted into a large number of spectral signal components, the method of the present invention may be applied most efficiently since crucial signals are then concentrated in specified frequencies and the extraction, separation and encoding of the variable length codes or the peak signal components raises the encoding efficiency.

What is claimed is:

1. A signal processing method in which the frequency spectrum of at least one of an input acoustic signal and an input video signal is split via sub-band coding and resulting signal components are quantized, comprising the steps of:
   dividing the signal components of said at least one of an input acoustic signal and an input video signal into a plurality of first band units as encoding units;
   dividing the signal components of one or more of said plurality of first band units into a plurality of second band units as frequency sub-band units for setting an initial value of quantization precision;
   setting the initial value of quantization precision for the first band units in accordance with an initial value of quantization precision computed for each of the second band units, more than one of said initial values of quantization precision computed for said second band units in at least one first band unit supplying a non-zero contribution which is used to compute the initial value of quantization precision for said at least one first band unit; and
   performing quantization of said first band units based on the set initial value of quantization precision.

2. The signal encoding method of claim 1, wherein said initial value of quantization precision computed for each said second band unit is a value approximating the maximum absolute value of the signal components in said each of the second band units.

3. The signal encoding method of claim 1, wherein said first band units become broader with increased frequency.

4. The signal encoding method of claim 1, wherein candidate peak components having the signal energy concentrated in the vicinity of specified signal components based on amplitude are extracted and separated from each of the second band units.

5. The signal encoding method of claim 4, wherein a sole peak component is extracted from consecutive ones of the extracted and separated peak component candidates.

6. The signal encoding method of claim 4, wherein all of the peak components are of the same bandwidth.

7. The signal encoding method of claim 4, wherein it is checked for each of the peak components whether or not these can be extracted with a narrowed bandwidth and, if the result of the check is affirmative, the peak components are extracted with narrowed bandwidths.

8. The signal encoding method of claim 1, wherein variable length code is used for encoding.

9. The signal encoding method of claim 1, wherein the input signal is an acoustic signal.

10. A signal encoding apparatus, comprising:
   means for dividing components of one of an input acoustic signal and an input video signal into a plurality of first band units as encoding units;
   means for dividing signal components of each of the first band units into a plurality of second band units as frequency sub-band units for setting an initial value of quantization precision;
   means for setting the initial value of quantization precision for the first band units in accordance with an initial value of quantization precision computed for each of the second band units in each first band unit, each of more than one of said initial values of quantization precision computed for said second band units of at least one first band unit supplying a non-zero contribution which is used to compute the initial value of quantization precision for said at least one first band unit; and means for performing quantization of said first band units based on the set initial value of quantization precision.

11. A signal processing method in which at least one of an input acoustic signal and an input video signal is transformed into frequency components and resulting frequency components are quantized, comprising the steps of:

dividing the frequency components of said at least one of an input acoustic signal and an input video signal into a plurality of first band units as encoding units;

dividing the frequency components of one or more of said plurality of first band units into a plurality of second band units as component units for setting an initial value of quantization precision of the encoding units;

setting the initial value of quantization precision for the first band units in accordance with an index computed for each of the second band units; and performing quantization of said first band units based on the set initial value of quantization precision.

12. The signal encoding method of claim 11, wherein said index is a value approximating the maximum absolute value of the frequency components in said each of the second band units.

13. The signal encoding method of claim 11, wherein said first band units become broader with increased frequency.

14. The signal encoding method of claim 11, wherein candidate peak components having the signal energy concentrated in the vicinity of specified signal components based on amplitude are extracted and separated from each of the second band units.

15. The signal encoding method of claim 14, wherein a sole peak component is extracted from consecutive ones of the extracted and separated peak component candidates.

16. The signal encoding method of claim 14, wherein all of the peak components are of the same bandwidth.

17. The signal encoding method of claim 14, wherein it is checked for each of the peak components whether or not these can be extracted with a narrowed bandwidth and, if the result of the check is affirmative, the peak components are extracted with narrowed bandwidths.

18. The signal encoding method of claim 11, wherein variable length code is used for encoding.

19. The signal encoding method of claim 11, wherein the input signal is an acoustic signal.

20. A signal encoding apparatus, comprising:

means for dividing frequency components of one of an input acoustic signal and an input video signal into a plurality of first band units as encoding units;

means for dividing the frequency components of each of the first band units into a plurality of second band units as component units for setting an initial value of quantization precision;

means for setting the initial value of quantization precision for the first band units in accordance with an index computed for each of the second band units; and means for performing quantization of said first band units based on the set initial value of quantization precision.

* * * * *